US005995562A

United States Patent [19]
Koizumi

[11] Patent Number: 5,995,562
[45] Date of Patent: Nov. 30, 1999

[54] MAXIMUM-LIKELIHOOD DECODING

[75] Inventor: Fumiaki Koizumi, Tokyo, Japan

[73] Assignee: NEC Corporation, Tokyo, Japan

[21] Appl. No.: 08/736,501

[22] Filed: Oct. 24, 1996

[30] Foreign Application Priority Data

Oct. 25, 1995 [JP] Japan .................................. 7-277332
Jan. 12, 1996 [JP] Japan .................................. 8-003531

[51] Int. Cl.⁶ .............................. H04L 27/06; H03D 1/00
[52] U.S. Cl. ........................ 375/341; 375/262; 375/265; 371/37.06; 371/43.6; 371/43.7; 371/43.4
[58] Field of Search .................................. 375/262, 265, 375/341; 371/43.4, 43.7, 43.6, 37.03, 37.06

[56] References Cited

U.S. PATENT DOCUMENTS

| | | |
|---|---|---|
| 4,811,346 | 3/1989 | Battail . |
| 4,932,029 | 6/1990 | Heichler . |
| 5,181,209 | 1/1993 | Hagenauer et al. . |
| 5,537,444 | 7/1996 | Nill et al. ................................ 375/341 |

FOREIGN PATENT DOCUMENTS 3-154521  7/1991  Japan .

OTHER PUBLICATIONS

Communications Technology for the 1990's and Beyond, Dallas, Nov. 27–30, 1989, vol. 3 of 3, Nov. 27, 1989, Institute of Electrical and Electronics Engineers, pp. 1680–1686, Hagenauer J. et al.: "A Viterbi Algorithm with Soft–Decision Outputs and Its Applications".

George C. Clark, Jr., "Reliability–of–Decoding Indicators for Maximum Likelihood Decoders", Proceedings of the 5th Hawaii International Conference on System Science, Honolulu, Hawaii, Western Periodicals, US, 1972, pp. 447–450.

*Primary Examiner*—Jason Chan
*Assistant Examiner*—Jean B Corrielus
*Attorney, Agent, or Firm*—Sughrue, Mion, Zinn, Macpeak & Seas, PLLC

[57] ABSTRACT

In a maximum-likelihood decoder, a reliability information of decoded data corresponding to a maximum-likelihood path is generated by using state codes previously assigned to the trellis states, respectively. After a survivor path is selected for each of the trellis states according to Viterbi algorithm, the survivor path is stored, and then a maximum-likelihood path is selected from the survivor paths stored. Based on at least two state codes each corresponding to a different trellis state, a reliability value is generated as the reliability information. Since the assigned state codes are used to generate the reliability information, the reliability criterion of decoded data is kept substantially at constant even when the conditions of input signals are changed, resulting in improved reliability of decoded data.

34 Claims, 10 Drawing Sheets

| MLD DECODED DATA BIT | REL | | REL LEVEL |
|---|---|---|---|
| 1 | 1 | 1 | ↑ HIGH |
| 1 | 1 | 0 | |
| 1 | 0 | 1 | |
| 1 | 0 | 0 | ↓ LOW |
| 0 | 1 | 1 | ↑ LOW |
| 0 | 1 | 0 | |
| 0 | 0 | 1 | |
| 0 | 0 | 0 | ↓ HIGH |

3-BIT SOFT-DECISION DATA

FIG.11

MAXIMUM-LIKELIHOOD DECODING

BACKGROUND OF THE INVENTION

1. Field of the Invention

The present invention generally relates to maximum-likelihood decoding, and in particular to a method of generating the reliability of data decoded by Viterbi decoding and a maximum-likelihood decoder using the method.

2. Description of the Related Art

In general, the maximum-likelihood decision circuit (MLD) of a Viterbi decoder generates decoded data as hard-decision information which is either 0 or 1. Although there has been soft-decision decoding, such a soft-decision scheme is only designed to receive an input analog signal as quantized multi-level signal so as to increase its coding gain.

Figure 1:
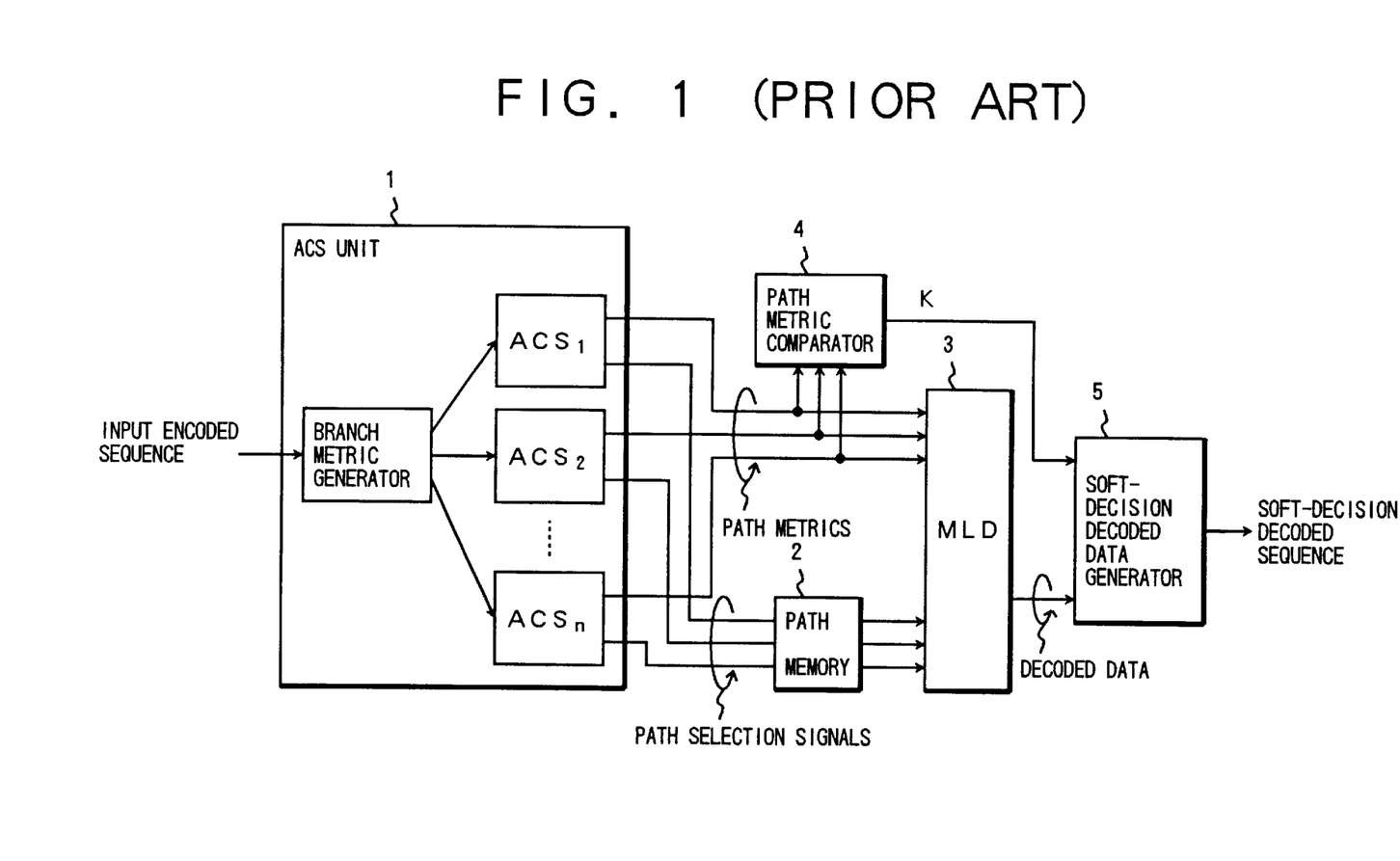
FIG. 1 is a block diagram showing a conventional Viterbi decoder.

In order to achieve the more increased reliability of decoded data, a soft-decision decoded information generator has been proposed in Japanese Patent Unexamined Publication NO. 3-154521, which is shown in FIG. 1.

Referring to FIG. 1, when receiving an input encoded (or received) sequence, an ACS (add-compare-select) unit 1 generates a survivor path metric and a survivor path selection signal for each state or node of the trellis diagram at each time. More specifically, a branch metric generator, receiving the input sequence, calculates two branch metrics for each state corresponding to the respective two paths leading to that state. In each of ACS circuits $ACS_1$–$ACS_n$ (n is the number of states of the trellis), these two branch metrics are added to the path metrics of the preceding two states, respectively, to produce two path metrics for that state. Subsequently, by comparing these path metrics, the one which has a larger path metric is selected as a survivor path at the state. The path selection information for the survivor paths are stored into a path memory 2 and the respective path metrics for the survivor paths are output to the MLD 3 and a path metric comparator 4.

The path metric comparator 4 compares the path metrics to each other to detect the maximum path metric from them. After the respective differences between the maximum path metric and other path metrics are calculated, the differences are accumulated to produce a value K as likelihood information, which is output to a soft-decision decoded data generator 5. In cases where four path metrics $M_1$–$M_4$ are generated by the $ACS_1$–$ACS_4$, the path metric comparator 4 performs the following calculations:

$M=\max(M_1, M_2, M_3, M_4)$ and $K=\Sigma(M-Mi)$.

Since the value K becomes larger as the output sequence is more likely, the value K serves as likelihood information.

Receiving the likelihood information K from the path metric comparator 4 and the most likely decoded data sequence from the MLD 3, a soft-decision decoded data generator 5 produces a soft-decision decoded data sequence such that the most likely decision decoded data bit is added as MSB (Most Significant Bit) to the data bits of the likelihood information K.

According to the conventional decoder, however, the likelihood information K is generated by the path metric comparator 4 directly using the path metrics Mi as described above. Such a method of generating the likelihood information, in some cases, has a disadvantage that the magnitude of the likelihood information K is varied depending on variations of the input signal condition. Especially, in the case of a Viterbi decoder for use in MLSE (maximum-likelihood sequence estimation) configuration, the path metric is varied with the magnitude of input data value and/or the amount of inter-symbol interference, which leads to changed criterion of the reliability of decoded data according to input conditions. Therefore, a likelihood information generator such as the path metric comparator 4 cannot generate the stable and accurate likelihood information. In other words, soft-decision decoded data cannot be obtained with sufficient reliability.

SUMMARY OF THE INVENTION

An object of the present invention is to provide a reliability information generating method which is able to improve the reliability of decoded data in a maximum-likelihood decoder.

Another object of the present invention is to provide a reliability information generating method which is capable of keeping the reliability criterion of decoded data substantially at constant even when the conditions of input signals are changed.

Still another object of the present invention is to provide a maximum-likelihood decoder which is able to-generate soft-decision decoded data with improved reliability.

Further still another object of the present invention is to provide a maximum-likelihood decoder used in maximum-likelihood sequence estimation (MLSE) which is able to improve the reliability of decoded data.

According to the present invention, a state code is previously assigned to each of trellis states and the assigned state codes are used to generate the reliability information. In other words, the reliability information is not generated by using path metrics but the previously assigned state codes.

In a maximum-likelihood decoder, the reliability information of decoded data corresponding to a maximum-likelihood path is generated as follows: a) assigning state codes to a predetermined number of trellis states, respectively; b) selecting a survivor path while discarding a discarded path for each of the trellis states according to Viterbi algorithm; c) storing the survivor path for each of the trellis states; d) selecting the maximum-likelihood path from the predetermined number of survivor paths stored; and e) generating a reliability value as the reliability information based on at least two state codes each corresponding to a different trellis state.

Since the assigned state codes are used to generate the reliability information as described above, the reliability criterion of decoded data is kept substantially at constant even when the conditions of input signals are changed, resulting in improved reliability of decoded data.

According to a first aspect of the present invention, the reliability value is generated at each time instant based on a difference between a first state code and a second state code corresponding to a maximum path metric and a minimum path metric of survivor paths at that time instant, respectively. More specifically, a first trellis state and a second trellis state are detected which correspond to the maximum path metric and the minimum path metric, respectively, at each time instant by comparing path metrics of the survivor paths at that time instant. A code distance between the first state code and the second state code corresponding to the first trellis state and the second trellis state is detected. Based on the code distance the reliability value is generated.

According to a second aspect of the present invention, the first state code and the second state code are converted into a first binary number and a second binary number. And the reliability value is generated based on a Hamming distance between the first binary number and the second binary number. In other words, the reliability value is generated based on a sum of binary numbers obtained by exclusive-OR in bits of the first binary number and the second binary number.

According to a third aspect of the, present invention, the reliability value is generated for each trellis state at each time instant based on a code differential between histories of the survivor path and the discarded path. More specifically, first a survivor path history and a discarded path history are generated when the survivor path is selected with a history length of the survivor path history and the discarded path history corresponding to the second predetermined number of past time instants. The code differential between the survivor path history and the discarded path history is detected at each time instant by comparing state codes assigned to two trellis states of the survivor path history and the discarded path history, respectively, at each of the past time instants. The code differential associated with the survivor path at each time instant is stored in a memory. The reliability value for each of sequential trellis states of the maximum likelihood path is generated based on the code differential corresponding to each of the sequential trellis states.

Preferably, the code differential is the number of mismatches between histories of the survivor path and the discarded path over the second predetermined number of past time instants. Further, the reliability value is determined according to a plurality of reliability levels into which the number of mismatches is classified in a predetermined order.

The maximum-likelihood decoder may be comprised of a soft-decision data generator which generates a soft-decision data sequence based on a data bit of the maximum-likelihood path and the reliability value generated.

DETAILED DESCRIPTION OF THE PREFERRED EMBODIMENTS

FIRST EMBODIMENT

Figure 2:
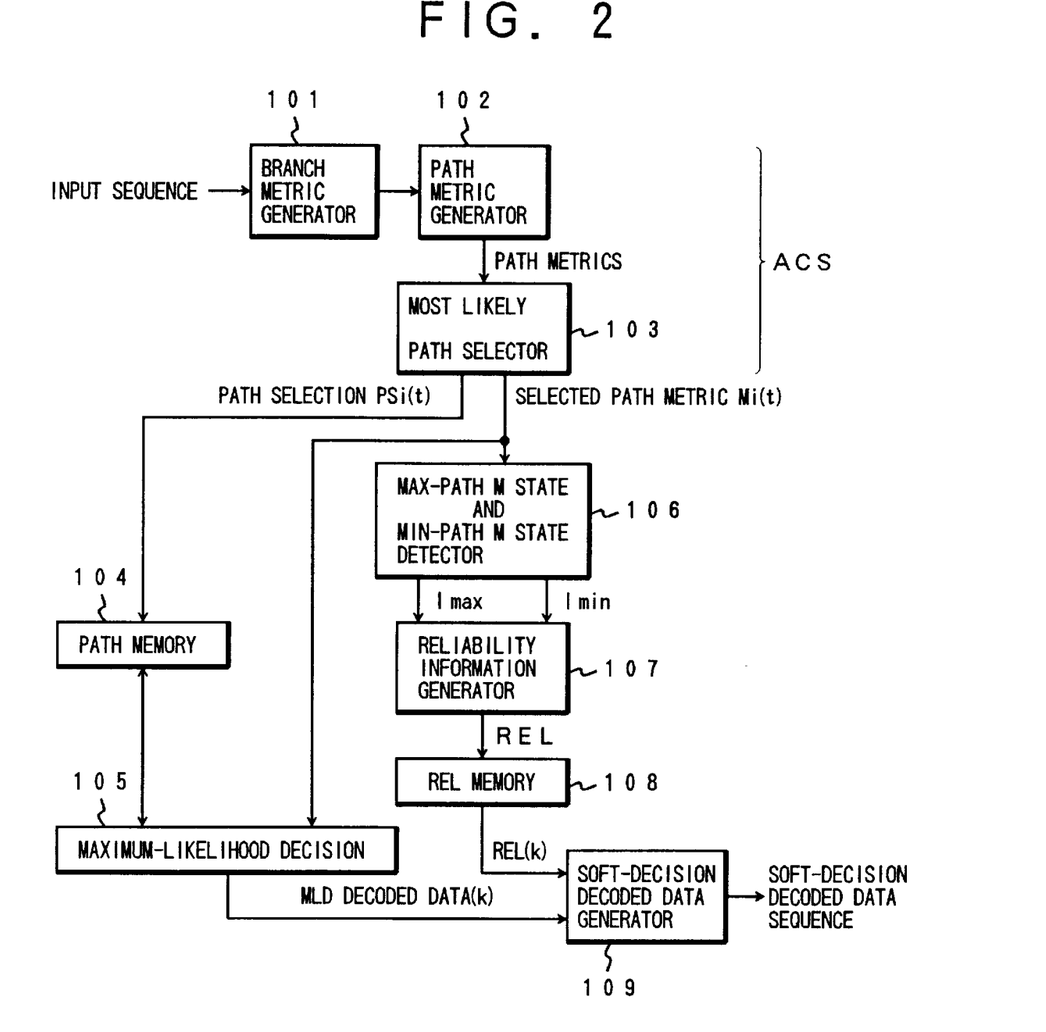
FIG. 2 is a block diagram showing a first embodiment of a Viterbi decoder according to the present invention.

Referring to FIG. 2, ACS, as well known, is comprised of a branch metric generator 101, a path metric generator 102, and a most likely path selector 103. The branch metric generator 101 generates at each state of the trellis two branch metrics corresponding to paths leading to that state by using an input sequence which is received from a channel estimator (not shown) in MLSE configuration. Receiving the branch metrics at each state from the branch metric generator 101, the path metric generator 102 generates two path metrics corresponding to the two paths to output them to the most likely path selector 103. The most likely path selector 103 selects the one which has a larger path metric as a survivor path at each state.

The survivor path selection information $PS_i(t)$ (the subscript i indicates each of the states of the trellis) is stored into a path memory 104 and the survivor path metric $M_i(t)$ is output to a maximum-likelihood decision (MLD) 105 and a state detector 106. Receiving the survivor path metrics from the most likely path selector 103, the MLD 105 selects the one which has the largest path metric among the survivor paths at time instant t and then reads the corresponding data sequence from the path memory 104 to produce a MLD decoded data sequence as hard-decision information.

The state detector 106 first compares the survivor path metrics, $M_1(t)$, $M_2(t)$, ..., and $M_s(t)$ to each other, where s is the number of states in the trellis: $s=2^n$ (n is a predetermined integer), to thereby obtain the maximum path metric $M_{max}(t)$ and the minimum path metric $M_{min}(t)$. After that, the state detector 106 detects two states $I_{max}(t)$ and $I_{min}(t)$ of the trellis corresponding to the maximum path metric $M_{max}(t)$ and the minimum pathmetric $M_{min}(t)$, respectively, and outputs them to a reliability information generator 107.

The reliability information generator 107 generates reliability information REL(T) using the two states $I_{max}(t)$ and $I_{min}(t)$ received from the state detector 106. The reliability information REL(t) is calculated as described later (see FIGS. 4 and 5). The reliability information REL(t) calculated is temporarily stored onto a REL memory 108 in order to synchronize with the MLD decoded data sequence. More specifically, the MLD path data sequence and the reliability information sequence REL are synchronously read from the path memory 104 and the REL memory 108, respectively, and are transferred to the soft-decision decoded data generator 109 in which a MLD decoded data bit is combined with the corresponding reliability information REL to produce a soft-decision decoded data sequence or a MLSE estimated soft-decision sequence.

Figure 3:
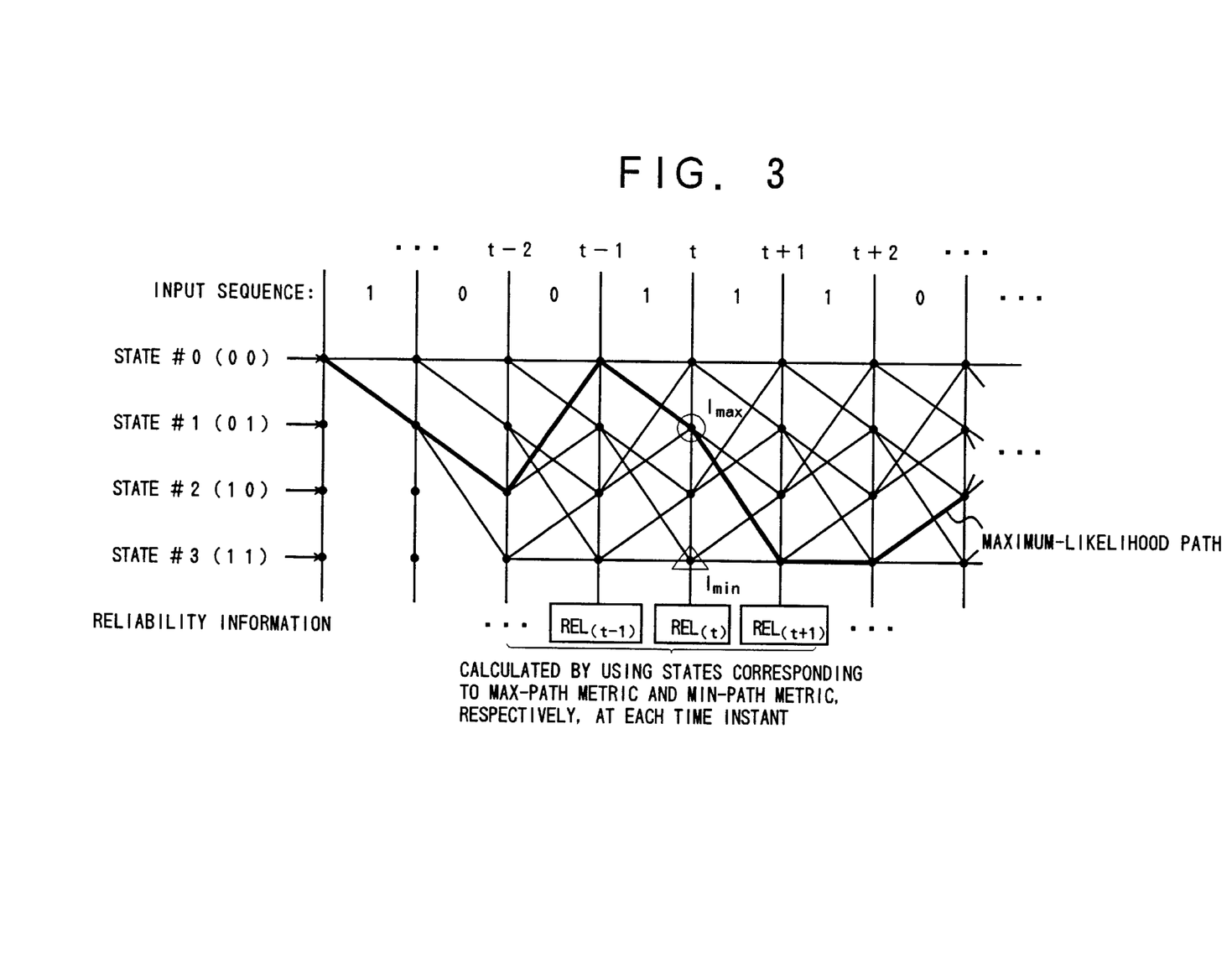
FIG. 3 is a trellis diagram showing a schematic operation of the first embodiment.

As shown in FIG. 3, it is assumed that a maximum-likelihood path indicated by a thick solid line in the figure is selected in the case of four states #1–#4 to which the respective four binary codes '00', '01', '10', and '11' are previously assigned, and further assumed that, at a time instant t, the state $I_{max}$ is #1 or binary code '01' and the state $I_{min}$ is #3 or binary code '11'. In such cases, the reliability information REL(t) at the time instant t is calculated by, for example, obtaining the code distance between the two state codes $I_{max}$ and $I_{min}$ as described later. A similar REL generation process is followed at other time instants to produce a sequence of the reliability information REL which is stored in the REL memory 108. The sequence of the reliability information REL stored corresponds to a code sequence of the maximum-likelihood path stored in the path memory 104.

RELIABILITY INFORMATION GENERATION

Figure 4:
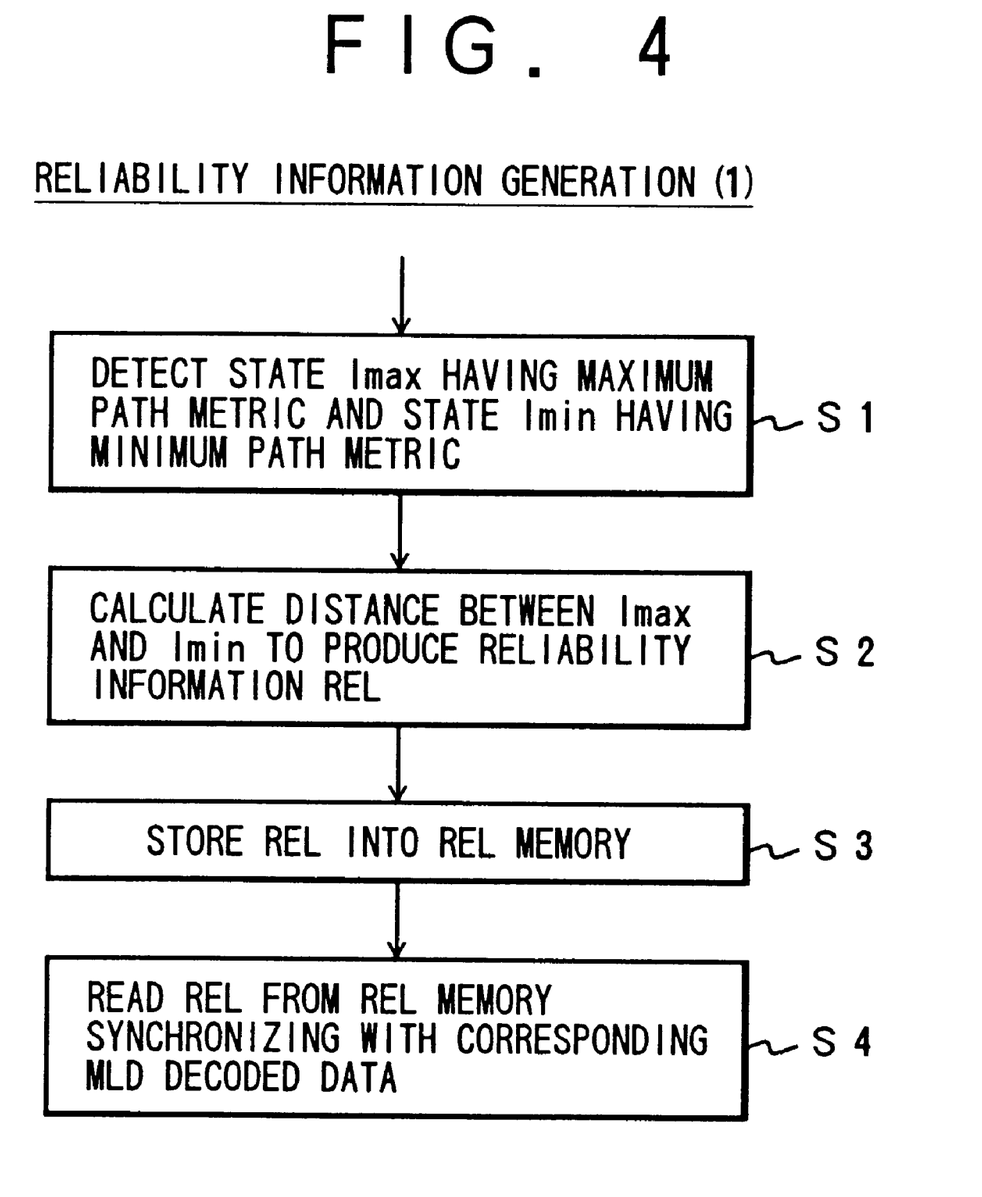
FIG. 4 is a flow chart showing a first embodiment of a reliability generation method according to the present invention.

Referring to FIG. 4, the state detector 106 first obtains the maximum path metric $M_{max}(t)$ and the minimum path metric $M_{min}(t)$ by comparing the survivor path metrics (for example, $M_1(t)$–$M_4(t)$) to each other. After that, the state detector 106 detects two states $I_{max}(t)$ and $I_{min}(t)$ corresponding to the maximum path metric $M_{max}(t)$ and the minimum path metric $M_{min}(t)$, respectively (step S1).

In cases where the respective codes, for example, '0', '1', '2', and '3' in decimal or '00', '01', '10', and '11' in binary are previously assigned to the states #1–#4 as shown in FIG. 3, the reliability information generator 107 generates reliability information REL(t) using a code distance between the two state codes $I_{max}$ and $I_{min}$ (step S2). More specifically, a code distance between the state $I_{max}$='01' (state #1) and the state $I_{min}$='11' (state #3) is obtained by calculating a difference between them, that is, '10' in binary or '2' in decimal. If the state $I_{max}$='00' (state #0) and the state $I_{min}$='11' (state #3), the code distance between them is '11' in binary or '3' in decimal. Needless to say, arbitrary code system may be used for the above state assignment.

The reliability information REL(t) calculated is sequentially stored onto a REL memory 108 so as to synchronize with the MLD decoded data sequence (step S3). And the MLD path data sequence and the reliability information sequence REL are synchronously read from the path memory 104 and the REL memory 108, respectively, and are transferred to the soft-decision decoded data generator 109 in which a MLD decoded data bit is combined with the corresponding reliability information REL to produce a soft-decision decoded data sequence or a MLSE estimated soft-decision sequence (step S4).

Figure 5:
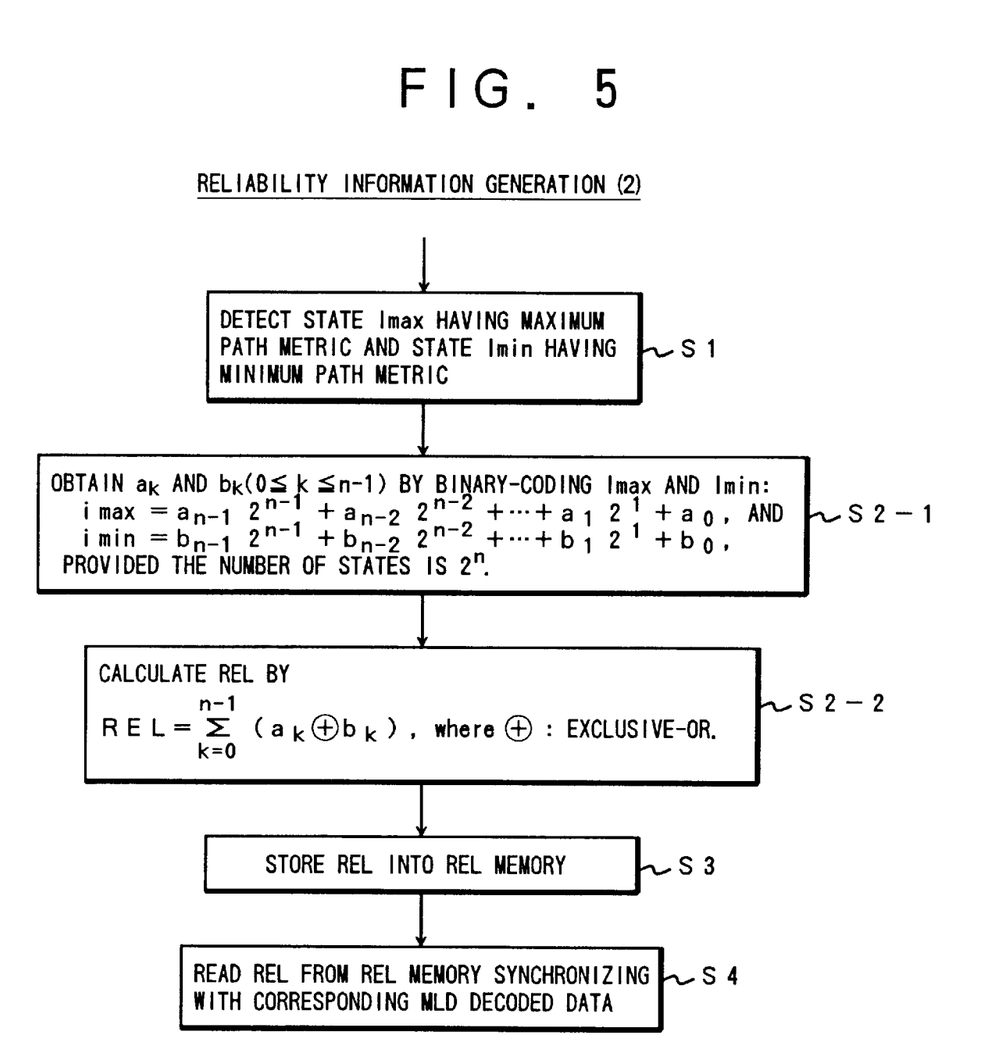
FIG. 5 is a flow chart showing a second embodiment of the reliability generation method according to the present invention.

Referring to FIG. 5, the reliability information REL may be calculated by the steps S2-1 and S2-2.

In cases where the respective $2^n$ decimal codes are previously assigned to the states #1–#$2^n$, the reliability information generator 107 first performs a decimal-to-binary conversion of the two state codes $I_{max}(t)$ and $I_{min}(t)$ to obtain a set of $a_k$ and $b_k$ ($0 \leq k \leq n-1$) (step S2-1). Subsequently, the reliability information generator 107 calculates the Exclusive-OR of $a_k$ and $b_k$ and then accumulates the results to produce the reliability information REL (step S2-2).

As described above, the reliability information REL is obtained based on the two states $I_{max}(t)$ and $I_{min}(t)$ corresponding to the maximum path metric $M_{max}(t)$ and the minimum path metric $M_{min}(t)$, respectively. Therefore, the stable reliability of decoded data is achieved in a maximum-likelihood decoder. Further, the reliability criterion of decoded data is kept substantially at constant even when the conditions of input signals are changed.

SECOND EMBODIMENT

Figure 6:
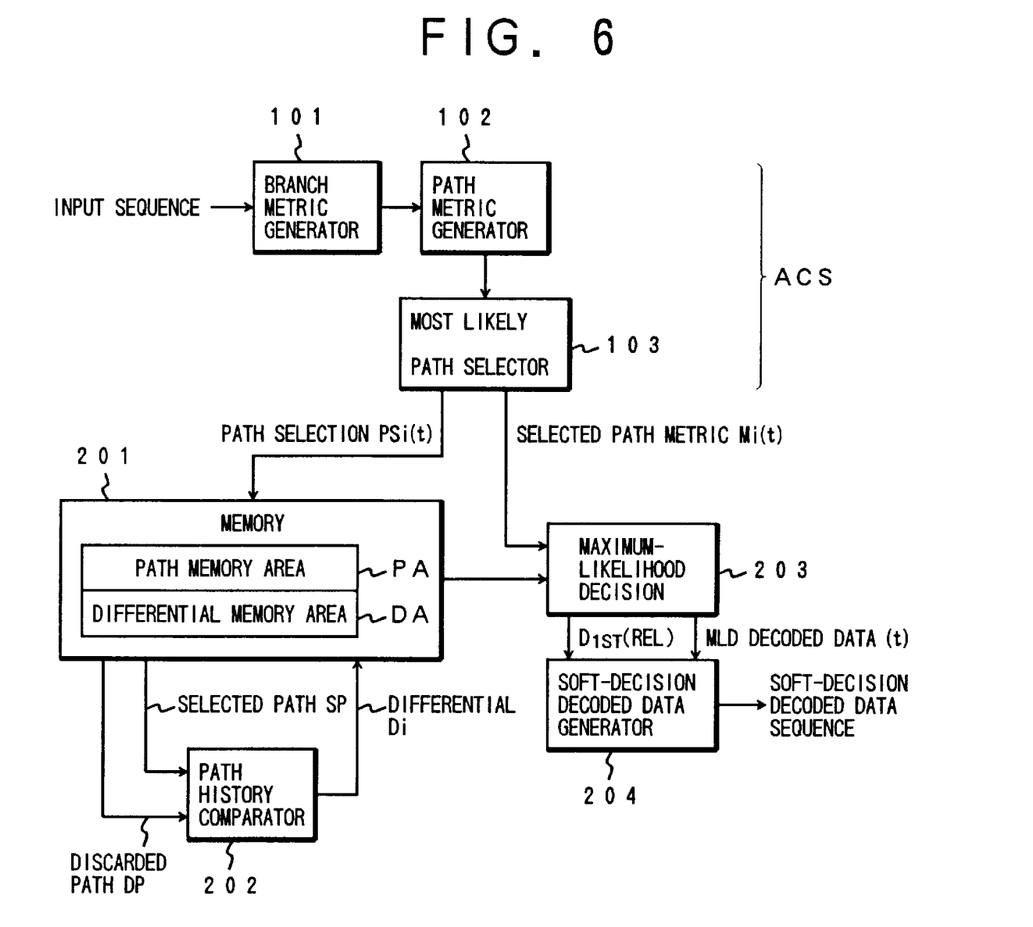
FIG. 6 is a block diagram showing a second embodiment of a Viterbi decoder according to the present invention.

Referring to FIG. 6, as in the case of the first embodiment of FIG. 2, the branch metric generator 101 generates at each state of the trellis two branch metrics corresponding to paths leading to that state by using an input sequence which is received from a channel estimator (not shown) in MLSE configuration. Receiving the branch metrics at each state from the branch metric generator 101, the path metric generator 102 generates two path metrics corresponding to the two paths to output them to the most likely path selector 103. The most likely path selector 103 selects the one which has a larger path metric as a survivor path at each state.

The survivor path selection information $PS_i(t)$ is stored into a path memory area PA of a memory 201. In addition to the path memory area PA, the memory 201 includes a differential memory area DA. When the memory 201 receives the survivor path selection information $PS_i(t)$ from the most likely path selector 103, both the survivor path history and the discarded path history are transferred from the memory 201 to a path history comparator 202. The path history comparator 202 compares them at each past time instant to count the number of times the survivor path and the discarded path was passing through different states. The count value is sent as a differential $D_i$ back to the memory 201 and is stored in the differential memory area DA thereof. As described later, the oldest differential stored in the differential memory area DA corresponding to a selected path is used as reliability information REL of the selected path to produce soft-decision decoded data.

A maximum-likelihood decision (MLD) 203 receives the survivor path metrics, $M_{\#1}(t)$, $M_{\#2}(t)$, ..., from the most likely path selector 103 and then selects the one which has the largest path metric among them at time instant t. After that, the selected path data is sequentially read from the path memory area PA of the memory 201 to produce a MLD decoded data sequence as hard-decision information. At the same time, the MLD 203 reads the oldest differential $D_{1ST}$ of the selected path from the differential memory area DA and sends it as the reliability information REL to a soft-decision decoded data generator 204.

PATH HISTORY COMPARISON

Figure 7:
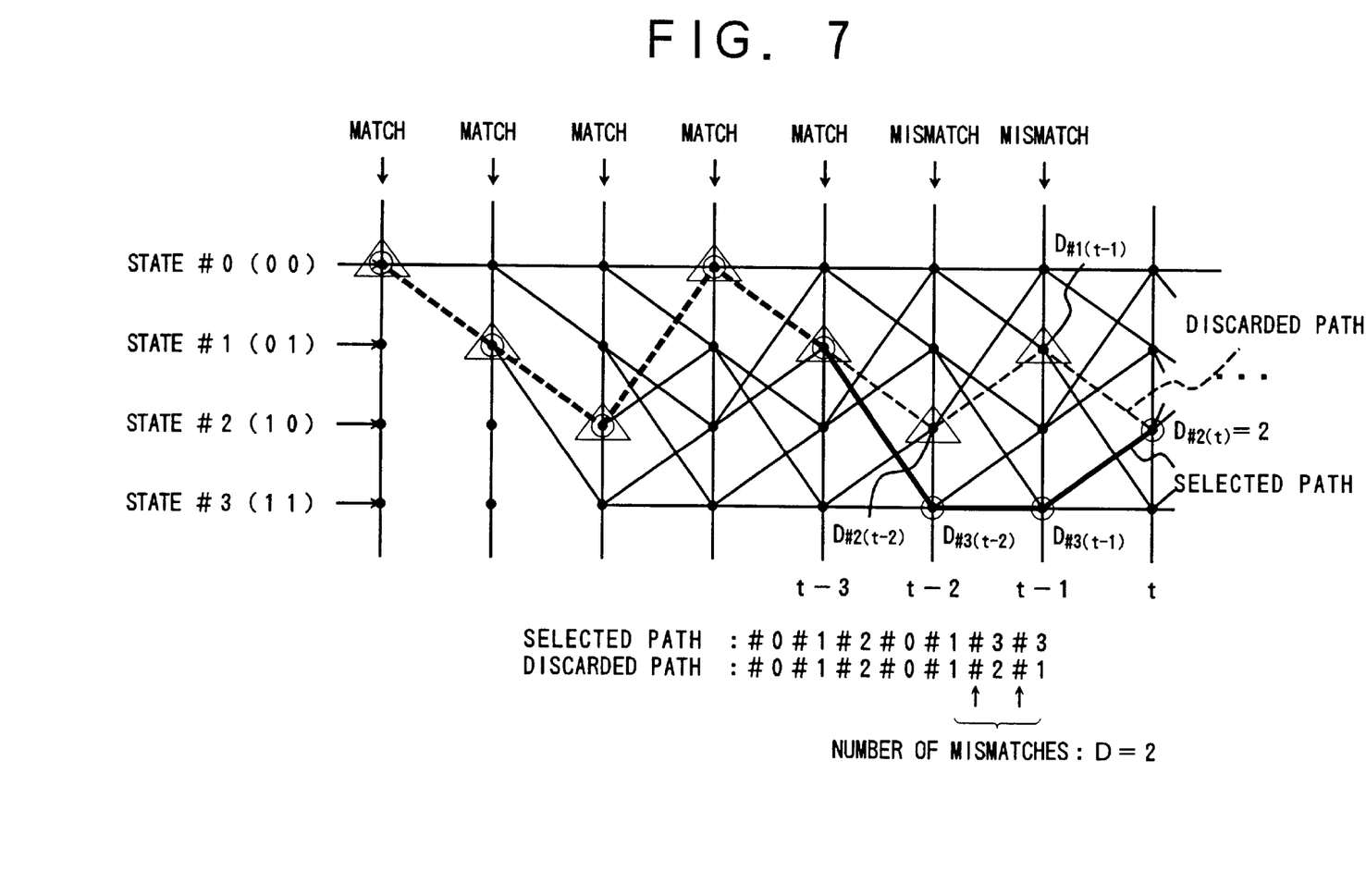
FIG. 7 is a trellis diagram showing a part of schematic operation of the second embodiment of the Viterbi decoder.

As shown in FIG. 7, it is assumed that, for two paths leading to the state #2 at time instant t, one path #0#1#2#0#1#3#3#2 is selected and the other path #0#1#2#0#1#2#1#2 is discarded. If such a path selection is not proper, some error bits may occur in MLSE bit decision at mismatch bits between the selected path and the discarded path. Therefore, the number of mismatch bits can serve as reliability information of the path selection.

Referring to FIG. 7, the path history comparator 202 compares the selected path with the discarded path at each past time instant and counts the number of mismatches between them. Since the last two states at time (t−2) and (t−1) are not coincident in this case, the number of mismatches, that is, a differential D=2 is sent back to the memory 201 and is stored at a memory location of the differential memory area DA corresponding to the selected path data at time instant t. In this manner, path selection data PS and the corresponding differential data D for each state at each time instant are stored in the path memory area PA and the differential memory area DA, respectively, until a predetermined amount of data is stored in the path memory area PA.

DIFFERENTIAL GENERATION

Figure 8:
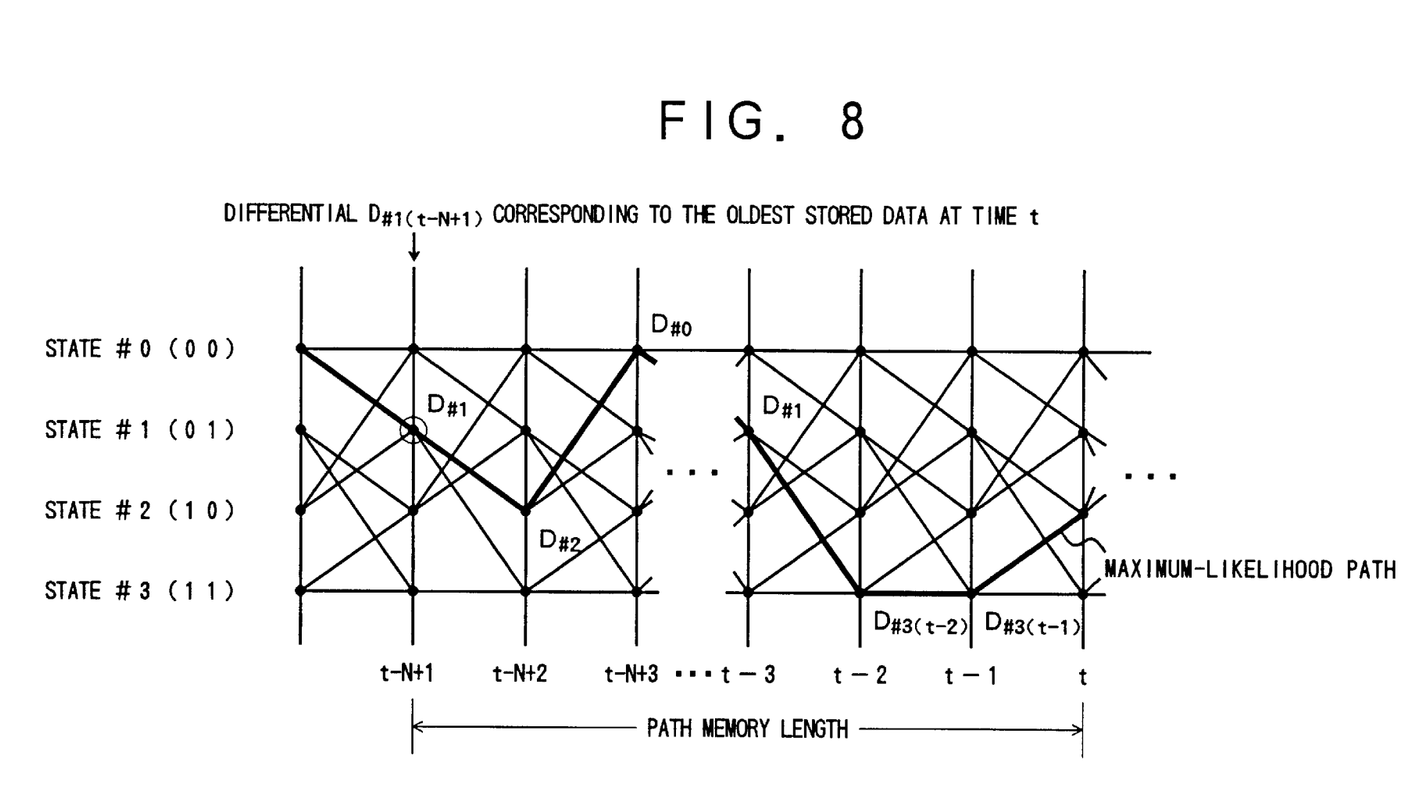
FIG. 8 is a trellis diagram showing another part of schematic operation of the second embodiment of the Viterbi decoder.

As shown in FIG. 8, it is assumed that the path memory area PA and the differential memory area DA have a memory capacity corresponding to N time instants and the MLD 203 selects the maximum-likelihood path, #0#1#2#0 . . . #1#3#3#2, where the respective path states have the differentials, $D_{\#0}D_{\#1}D_{\#2}D_{\#0}$... $D_{\#1}D_{\#3}D_{\#3}D_{\#2}$, a sequence of which has been stored in the differential memory area DA of the memory 201. In this case, when selecting the maximum-likelihood path, the MLD 203 further selects the differential $D_{\#1}(t-N+1)$ corresponding to the oldest data of the maximum-likelihood path as reliability information of the MLD decoded data sequence.

MLSE DECODING PROCESS

Figure 9:
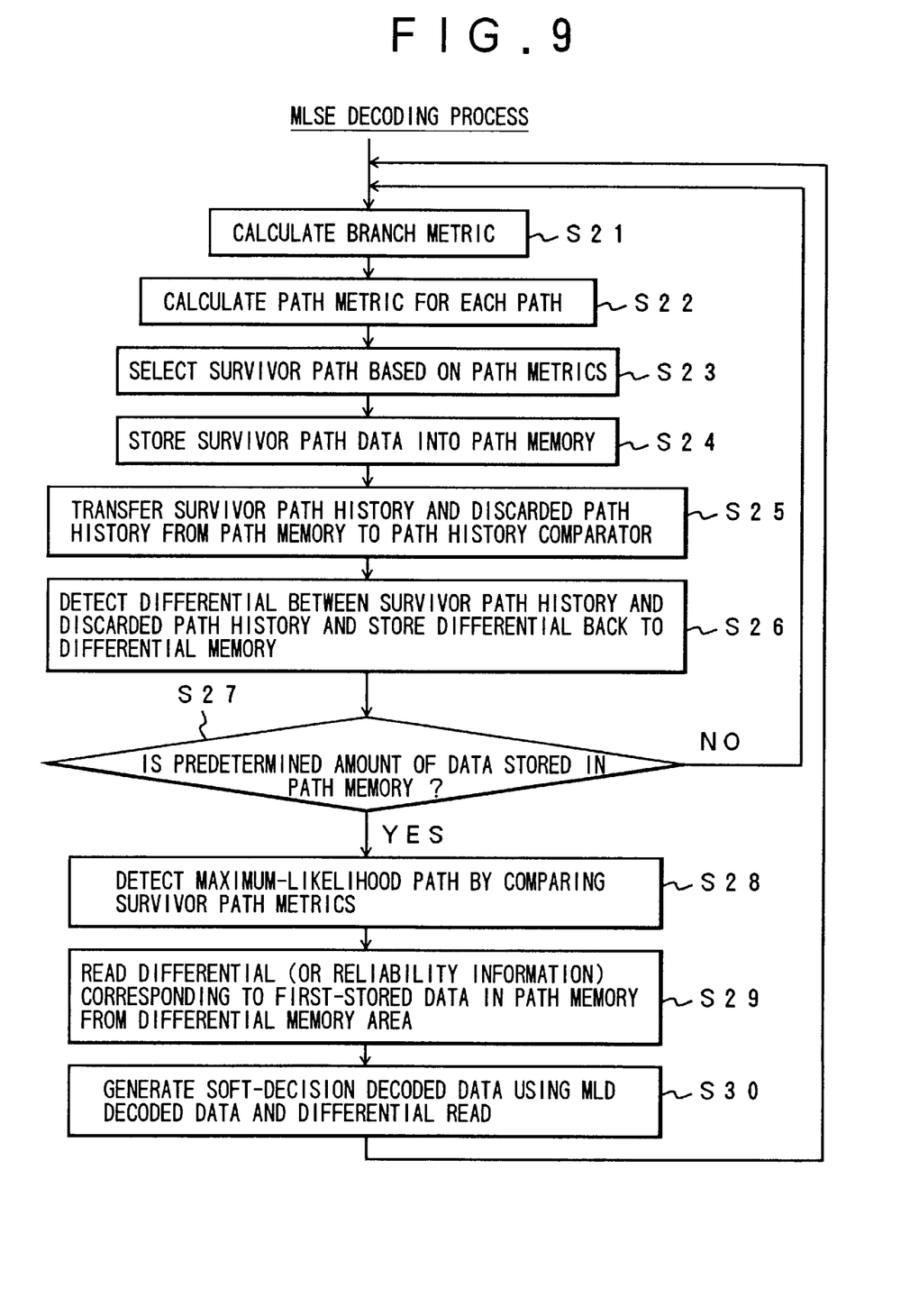
FIG. 9 is a flow chart showing a maximum-likelihood decoding operation of the second embodiment of the Viterbi decoder.

Referring to FIG. 9, upon receiving the input sequence from a channel equalizer of MLSE (not shown), the branch metric generator 101 calculates two branch metrics corresponding to paths leading to that state at a time instant (step S21). Receiving the branch metrics at each state from the branch metric generator 101, the path metric generator 102 calculates two path metrics corresponding to the two paths (step S22). The most likely path selector 103 selects the one which has the most likely path as a survivor path based on the path metrics at each state and the survivor path selection information is stored into the path memory area PA of the memory 201 (step S24). When the memory 201 receives the survivor path selection information from the most likely path selector 103, both the survivor path history and the discarded path history are transferred from the memory 201 to the path history comparator 202 (step S25).

The path history comparator 202 generates differentials by comparing the survivor path history and the discarded path history at each past time instant to count the number of mismatches between them as the differentials. The differentials are stored in the differential memory area DA of the memory 201 (step S26). The above steps S21–S26 are repeatedly performed at each time instant until a predetermined amount of data is stored in the path memory area PA or the amount of stored data reaches the capacity limit of the path memory area PA (step S27).

When the amount of stored data reaches the capacity limit (Yes of step S27), the path memory area PA and the differential memory area DA are updated as follows. The MLD 203 selects the maximum-likelihood path by comparing survivor path metrics at a time instant K (step S28). Subsequently, the MLD 203 reads the oldest differential $D_{1ST}$ corresponding to the first-stored data of the maximum-likelihood path in the differential memory area DA and sends it as the reliability information REL to the soft-decision decoded data generator 204 (step S29). The soft-decision decoded data generator 204 uses the differential $D_{1ST}$ and the MLD decoded data sequence to generate the soft-decision decoded data sequence as described hereinafter.

SOFT-DECISION DATA GENERATION

As described before, since the differential $D_{1ST}$ represents the number of mismatches, the larger the differential, the lower the reliability. Therefore the soft-decision decoded data may be generated such that the MLD decoded data bit, a 0 or a 1, is added as MSB (Most Significant Bit) to the data bits of the differential $D_{1ST}$.

Figure 10:
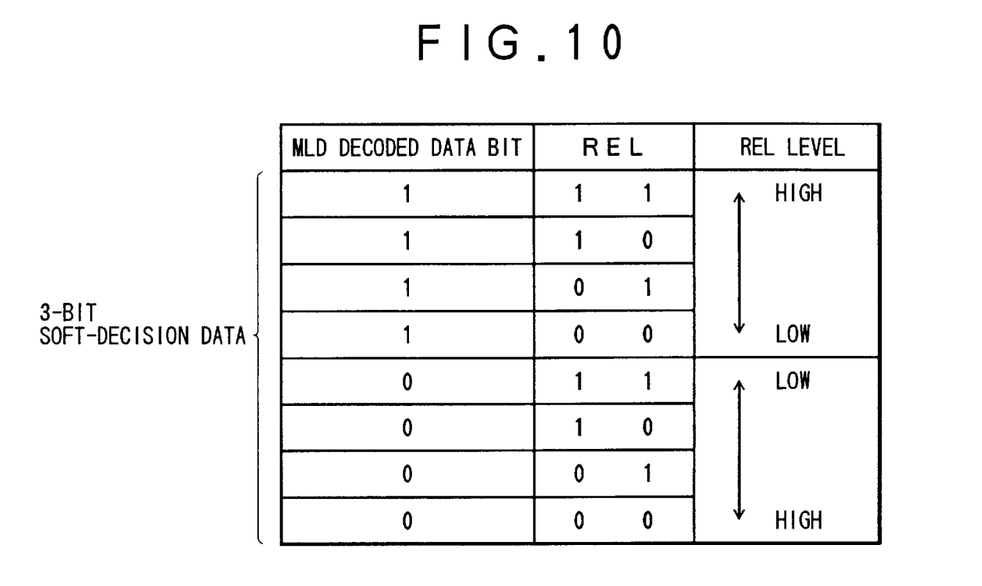
FIG. 10 is a diagram showing an example of soft-decision data generated by the embodiments of the Viterbi decoder.

As shown in FIG. 10, the differential $D_{1ST}$ may be classified into a plurality of levels of reliability in the soft-decision decoded data generator 204. For simplicity, let us assume 3-bit soft-decision data with the MLD decoded data bit as MSB and four reliability levels. The four reliability levels may be represented by two bits: 00, 01, 10, and 11. In the case where the MLD decoded data bit is '1', a reliability level is set to increase in the order of 00, 01, 10, and 11. However, in the case where the MLD decoded data bit is '0', a reliability level is set to decrease in the order of 00, 01, 10, and 11. By generating the soft-decision data in such a manner, the larger the 3-bit soft-decision data, the larger the possibility that the MLD decoded data bit is '1', and the smaller the 3-bit soft-decision data, the larger the possibility that the MLD decoded data bit is '0'.

As described above, the reliability information REL is obtained based on the number of mismatches between a survivor path history and a discarded path history. Therefore, the stable reliability of decoded data is achieved in a maximum-likelihood decoder. Further, the reliability criterion of decoded data is kept substantially at constant even when the conditions of input signals are changed.

Figure 11:
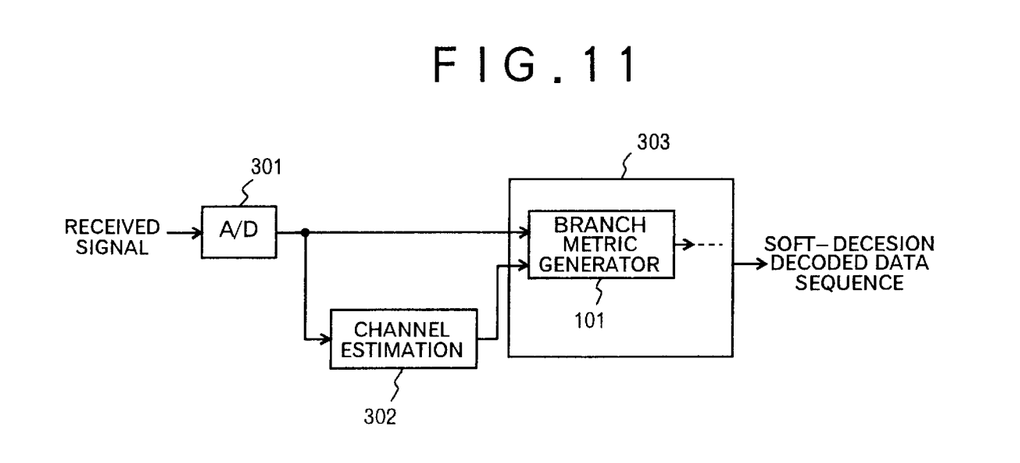
FIG. 11 is a schematic block diagram showing a MLSE configuration for use in a mobile telephone terminal including a Viterbi decoder according to the present invention.

The embodiments as described above can be employed in the MLSE configuration of a mobile communication terminal as shown in FIG. 11. More specifically, after demodulation, a received signal is converted into digital by an analog-to-digital converter 301. The digital signal is output to a channel estimator 302 which generates estimation data used for branch metric calculation of a Viterbi decoder 303 according to the present invention. The Viterbi decoder 303 generates the soft-decision decoded data sequence based on the digital signal and the estimation data for branch metric calculation. The reliability information generation methods and Viterbi decoders like these is suitable for mobile communication terminals such as a mobile telephone terminal.

What is claimed is:

1. A method for generating reliability information of decoded data corresponding to a maximum-likelihood path in a maximum-likelihood decoder, comprising the steps of:

a) assigning predetermined state codes to a predetermined number of trellis states according to Viterbi algorithm;

b) selecting a survivor path while discarding a discarded path for each of the trellis states according to Viterbi algorithm;

c) storing the survivor path for each of the trellis states; and d) selecting the maximum-likelihood path from the survivor paths stored, e) generating a reliability value as the reliability information, of said decoded data corresponding to said maximum-likelihood path, at each time instant based on a difference between a first state code and a second state code corresponding to a maximum path metric and a minimum path metric of survivor paths at that time instant, respectively.

2. The method according to claim 1, wherein the step e) comprises the steps of:

detecting a first trellis state and a second trellis state corresponding to the maximum path metric and the minimum path metric, respectively, at each time instant by comparing path metrics of the survivor paths at that time instant;

detecting a code distance between the first state code and the second state code corresponding to the first trellis state and the second trellis state; and generating the reliability value based on the code distance.

3. The method according to claim 1, wherein the reliability value is generated based on a Hamming distance between the first state code and the second state code.

4. The method according to claim 3, wherein the reliability value is generated based on a sum of binary numbers obtained by exclusive-OR in bits of the first state code and the second state code.

5. The method according to claim 3, further comprising the steps of:

generating a soft-decision data sequence based on a data bit of the maximum-likelihood path and the reliability value generated.

6. The method according to claim 1, further comprising the steps of:

generating a soft-decision data sequence based on a data bit of the maximum-likelihood path and the reliability value generated.

7. The method according to claim 1, wherein the predetermined state codes number the trellis states in ascending numeric order.

8. A method for generating reliability information of decoded data corresponding to a maximum-likelihood path in a maximum-likelihood decoder, comprising the steps of:
   a) assigning state codes to a predetermined number of trellis states, respectively;
   b) selecting a survivor path and discarding a discarded path for each of said trellis states according to a Viterbi algorithm;
   c) storing said survivor path for each of said trellis states to provide stored survivor paths;
   d) selecting said maximum-likelihood path from said stored survivor paths; and
   e) generating a reliability value as said reliability information based on at least two state codes each corresponding to a different one of said trellis states, said reliability value being generated for each of said trellis states at each of a predetermined number of time instants based on a corresponding code differential between histories of said survivor path and said discarded path;
   wherein said step e) includes:
      generating a survivor path history and a discarded path history when said survivor path is selected, a history length of said survivor path history and said discarded path history corresponding to said predetermined number of said time instants;
      detecting said code differential between said survivor path history and said discarded path history at each of said time instants by comparing state codes assigned to two trellis states of said survivor path history and said discarded path history, respectively;
      storing said code differential associated with said survivor path at each of said time instants; and
      generating said reliability value for each of said predetermined number of said trellis states of said maximum likelihood path based on said corresponding code differential.

9. The method according to claim 7, wherein said code differential is represented by a number of mismatches between said histories of said survivor path and said discarded path over said predetermined number of said time instants.

10. The method according to claim 8, wherein said reliability value is determined according to a plurality of reliability levels into which said number of mismatches is classified in a predetermined order.

11. The method according to claim 8, further comprising the steps of:
   generating a soft-decision data sequence based on a data bit of said maximum-likelihood path and said reliability value generated.

12. A method for generating reliability information of decoded data corresponding to a maximum-likelihood path in a maximum-likelihood decoder, comprising the steps of:
   a) assigning state codes to a predetermined number of trellis states, respectively;
   b) selecting a survivor path and discarding a discarded path for each of said trellis states according to a Viterbi algorithm;
   c) storing said survivor path for each of said trellis states to provide stored survivor paths in said predetermined number;
   d) selecting said maximum-likelihood path from said stored survivor paths; and
   e) generating a reliability value as said reliability information, of said decoded data corresponding to said maximum-likelihood path, based on at least two state codes each corresponding to a different one of said trellis states, said reliability value being generated for each of said trellis states at each of a predetermined number of time instants based on a corresponding code differential between histories of said survivor path and said discarded path; wherein said code differential is represented by a number of mismatches between said histories of said survivor path and said discarded path over said predetermined number of said time instants.

13. The method according to claim 12, further comprising the steps of:
   generating a soft-decision data sequence based on a data bit of said maximum-likelihood path and said reliability value generated.

14. The method according to claim 13, wherein said reliability value is determined according to a plurality of reliability levels into which said number of mismatches is classified according to a predetermined order.

15. A method for generating reliability information of decoded data corresponding to a maximum-likelihood path in a maximum-likelihood decoder, comprising the steps of:
   a) assigning state codes to a predetermined number of trellis states, respectively;
   b) selecting a survivor path and discarding a discarded path for each of said trellis states according to a Viterbi algorithm;
   c) storing said survivor path for each of said trellis states to provide stored survivor paths in said predetermined number;
   d) selecting said maximum-likelihood path from said stored survivor paths; and
   e) generating a reliability value as said reliability information, of said decoded data corresponding to said maximum-likelihood path, based on at least two state codes each corresponding to a different one of said trellis states, said reliability value being generated for each of said trellis states at each of a predetermined number of time instants based on a corresponding code differential between histories of said survivor path and said discarded path;
      wherein said reliability value is determined according to a plurality of reliability levels into which a number of mismatches, between said histories of said survivor path and said discarded path over said predetermined number of said time instants, is classified in a predetermined order.

16. The method according to claim 15, further comprising the steps of:
   generating a soft-decision data sequence based on a data bit of the maximum-likelihood path and the reliability value generated.

17. A system for generating reliability information of decoded data corresponding to a maximum-likelihood path, comprising:
   means for selecting a survivor path while discarding a discarded path for each of a predetermined number of trellis states according to Viterbi algorithm, the trellis states having N predetermined state codes previously assigned thereto, respectively;
   means for storing the survivor path for each of the trellis states; and
   means for selecting the maximum-likelihood path from the survivor paths stored; and
   means for generating a reliability value as the reliability information, of said decoded data corresponding to said maximum-likelihood path, at each time instant based on a difference between a first state code and a second state code corresponding to a maximum path metric and a minimum path metric of survivor paths at that time instant, respectively.

18. The system according to claim 17, wherein the generating means comprises:

first detecting means for detecting a first trellis state and a second trellis state corresponding to the maximum path metric and the minimum path metric, respectively, at each time instant by comparing path metrics of the survivor paths at that time instant;

second detecting means for detecting a code distance between the first state code and the second state code corresponding to the first trellis state and the second trellis state; and reliability generating means for generating the reliability value based on the code distance.

19. The system according to claim 17, wherein the generating means comprises:

detecting means for detecting a first trellis state and a second trellis state corresponding to the maximum path metric and the minimum path metric, respectively, at each time instant by comparing path metrics of the survivor paths at that time instant;

converting means for converting the first state code and the second state code into a first binary number and a second binary number, the first state code and the second state code corresponding to the first trellis state and the second trellis state, respectively; and reliability generating means for generating the reliability value based on a Hamming distance between the first binary number and the second binary number.

20. The system according to claim 19, wherein the reliability generating means generates the reliability value based on a Hamming distance between the first state code and the second state code.

21. The system according to claim 17, wherein the predetermined state codes number the N trellis states in ascending numeric order.

22. A system for generating reliability information of decoded data corresponding to a maximum-likelihood path in a maximum-likelihood decoder, comprising:

first selecting means for selecting a survivor path and discarding a discarded path for each of a predetermined number of trellis states according to Viterbi algorithm, said trellis states having respective state codes;

storing means for storing said survivor path for each of said trellis states to provide stored survivor paths in said predetermined number;

second selecting means for selecting said maximum-likelihood path from said stored survivor paths; and generating means for generating a reliability value as the reliability information based on at least two state codes each corresponding to a different one of said trellis states;

wherein said generating means comprises:

survivor path generating means for generating a survivor path history and a discarded path history when said survivor path is selected, a history length of said survivor path history and said discarded path history corresponding to a predetermined number of time instants;

detecting means for detecting a corresponding code differential between said survivor path history and said discarded path history at each time instant by comparing said state codes assigned to two of said trellis states of said survivor path history and said discarded path history, respectively, at each of said predetermined number of time instants;

storing means for storing said code differential associated with said survivor path at each time instant; and reliability generating means for generating said reliability value for each of said predetermined number of said trellis states of the maximum likelihood path based on the corresponding code differential.

23. The system according to claim 22, wherein said code differential is represented by a number of mismatches between said histories of said survivor path and said discarded path over said predetermined number of said time instants.

24. The system according to claim 23, wherein said reliability value is determined according to a plurality of reliability levels into which said number of mismatches is classified in a predetermined order.

25. The system according to claim 22, further comprising:

soft-decision generating means for generating a soft-decision data sequence based on a data bit of said maximum-likelihood path and said reliability value.

26. The system according to claim 24, further comprising:

soft-decision generating means for generating a soft-decision data sequence based on a data bit of said maximum-likelihood path and said reliability value.

27. A maximum-likelihood decoder comprising:

first means for generating two path metrics for each of a predetermined number of trellis states at each time instant according to an input sequence, the trellis states having state codes assigned thereto, respectively;

second means for selecting a survivor path while discarding a discarded path for each of the trellis states according to Viterbi algorithm;

storing means for storing the survivor path for each of the trellis states;

selecting means for selecting a maximum-likelihood path from the survivor paths stored;

first detecting means for detecting a first trellis state and a second trellis state corresponding to the maximum path metric and the minimum path metric, respectively, at each time instant by comparing path metrics of the survivor paths at that time instant;

second detecting means for detecting a code distance between the first state code and the second state code corresponding to the first trellis state and the second trellis state; and reliability generating means for generating a reliability value of decoded data corresponding to the maximum-likelihood path based on the code distance.

28. The maximum-likelihood decoder according to claim 27, wherein the generating means comprises:

detecting means for detecting a first trellis state and a second trellis state corresponding to the maximum path metric and the minimum path metric, respectively, at each time instant by comparing path metrics of the survivor paths at that time instant;

converting means for converting the first state code and the second state code into a first binary number and a second binary number, the first state code and the second state code corresponding to the first trellis state and the second trellis state, respectively; and reliability generating means for generating the reliability value based on a Hamming distance between the first binary number and the second binary number.

29. The maximum-likelihood decoder according to claim 28, wherein the reliability value is generated based on a sum of binary numbers obtained by exclusive-OR in bits of the first state code and the second state code.

30. The maximum-likelihood decoder according to claim 27, further comprising:

soft-decision generating means for generating a soft-decision data sequence based on a data bit of the maximum-likelihood path and the reliability value generated.

31. A maximum-likelihood decoder comprising:

means for generating two path metrics for each of a predetermined number of trellis states at each of a predetermined number of time instants according to an input sequence, said trellis states having respective state codes;

means for selecting a survivor path and discarding a discarded path for each of said predetermined number of trellis states according to Viterbi algorithm;

means for storing said survivor path for each of said trellis states to provide stored survivor paths in said predetermined number;

means for selecting a maximum-likelihood path from said stored survivor paths stored; and means for generating a reliability value of decoded data, corresponding to said maximum-likelihood path, based on at least two state codes each corresponding to a different one of said trellis states, said means for generating a reliability value comprising:

means for generating a survivor path history and a discarded path history when said survivor path is selected, a history length of said survivor path history and said discarded path history corresponding to said predetermined number of said time instants;

means for detecting said code differential between said survivor path history and said discarded path history at each time instant by comparing state codes assigned to two trellis states of said survivor path history and said discarded path history, respectively, at each of said past time instants; and means for storing said code differential associated with said survivor path at each time instant;

said means for generating said reliability value generating said reliability value for each of sequential trellis states of said maximum likelihood path based on said code differential corresponding to each of said sequential trellis states.

32. The maximum-likelihood decoder according to claim 31, wherein said code differential is represented by a number of mismatches between said histories of said survivor path and said discarded path over said predetermined number of said time instants.

33. The maximum-likelihood decoder according to claim 32, wherein said reliability value is determined according to a plurality of reliability levels into which said number of mismatches is classified in a predetermined order.

34. The maximum-likelihood decoder according to claim 33, further comprising:

means for generating a soft-decision data sequence based on a data bit of said maximum-likelihood path and said reliability value.

* * * * *

UNITED STATES PATENT AND TRADEMARK OFFICE
CERTIFICATE OF CORRECTION

PATENT NO.: 5,995,562
DATED: November 30, 1999
INVENTOR(S): Fumiaki KOIZUMI

It is certified that error(s) appears in the above-identified patent and that said Letters Patent is hereby corrected as shown below:

Column 4, line 38, delete "REL(T)" and insert therefor --REL(t)--.

Column 7, line 29, delete "528" and insert therefor --S28--.

Column 8, line 26, after "the" (second occurrence) insert --predetermined number of--.

Column 9, line 38, delete "7" and insert therefor "8".

Column 10, line 65, after "the" insert --predetermined number of--.

Column 12, line 39, after "the" insert --predetermined number of--.

Signed and Sealed this

Twenty-fourth Day of April, 2001

Attest:

NICHOLAS P. GODICI

*Attesting Officer*   *Acting Director of the United States Patent and Trademark Office*